United States Patent
Muraki et al.

(10) Patent No.: US 10,403,524 B2
(45) Date of Patent: Sep. 3, 2019

(54) SUBSTRATE PROCESSING DEVICE AND METHOD OF MANUFACTURING SEMICONDUCTOR DEVICE

(71) Applicant: TOSHIBA MEMORY CORPORATION, Minato-ku, Tokyo (JP)

(72) Inventors: Shinsuke Muraki, Mie (JP); Hiroaki Yamada, Mie (JP); Yuya Akeboshi, Mie (JP); Katsuhiro Sato, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/989,887

(22) Filed: May 25, 2018

(65) Prior Publication Data

US 2018/0277407 A1 Sep. 27, 2018

Related U.S. Application Data

(62) Division of application No. 15/449,308, filed on Mar. 3, 2017, now Pat. No. 10,008,400.

(30) Foreign Application Priority Data

Sep. 16, 2016 (JP) .................... 2016-182167

(51) Int. Cl.
*H01L 21/67* (2006.01)
*H01L 21/3213* (2006.01)
(Continued)

(52) U.S. Cl.
CPC .......... *H01L 21/67242* (2013.01); *C23F 1/16* (2013.01); *C23F 1/26* (2013.01);
(Continued)

(58) Field of Classification Search
None
See application file for complete search history.

(56) References Cited

U.S. PATENT DOCUMENTS 5,830,375 A * 11/1998 Huang ............. H01L 21/31111
216/84
6,512,270 B2 * 1/2003 Satou ................. H01L 27/1214
257/347

(Continued)

FOREIGN PATENT DOCUMENTS

JP 03-039491 A 2/1991
JP 07-230981 A 8/1995
(Continued)

*Primary Examiner* — Allan W. Olsen
(74) *Attorney, Agent, or Firm* — Foley & Lardner LLP

(57) ABSTRACT

A substrate processing device capable of stabilizing an etching amount of a metal film provided on a substrate is provided. The substrate processing device includes a first container, a second container and a control unit. The first container stores a first liquid in which an acid solution containing phosphoric acid and water are mixed. The first liquid is capable of etching a metal film provided on a substrate. The second container stores a second liquid containing water. The control unit controls supply of the second liquid from the second container to the first container such that a water concentration of the first liquid increases over time corresponding to change in a concentration of the phosphoric acid in the first liquid.

8 Claims, 7 Drawing Sheets

(51) Int. Cl.
*H01L 21/306* (2006.01)
*H01L 21/28* (2006.01)
*C23F 1/16* (2006.01)
*C23F 1/26* (2006.01)

(52) U.S. Cl.
CPC ........ *H01L 21/28* (2013.01); *H01L 21/30604* (2013.01); *H01L 21/32134* (2013.01); *H01L 21/67017* (2013.01); *H01L 21/67057* (2013.01); *H01L 21/67075* (2013.01); *H01L 21/67086* (2013.01)

(56) References Cited

U.S. PATENT DOCUMENTS

| | | | |
|---|---|---|---|
| 7,112,795 B2 * | 9/2006 | Lee | C23F 1/00 250/339.07 |
| 9,528,079 B2 * | 12/2016 | Ida | H01L 21/31111 |
| 9,543,162 B2 * | 1/2017 | Hinode | H01L 21/67028 |
| 10,096,486 B2 * | 10/2018 | Muraki | H01L 21/32134 |
| 2002/0125533 A1 * | 9/2002 | Satou | H01L 27/1214 257/347 |
| 2003/0093917 A1 | 5/2003 | DiBello | |
| 2003/0176979 A1 | 9/2003 | Ottow et al. | |
| 2003/0235997 A1 * | 12/2003 | Lee | C23F 1/00 438/745 |
| 2005/0092620 A1 | 5/2005 | Mavliev et al. | |
| 2005/0136672 A1 * | 6/2005 | Fujikawa | C23F 1/20 438/691 |
| 2005/0233578 A1 * | 10/2005 | Jia | B23H 5/08 438/633 |
| 2006/0175298 A1 * | 8/2006 | Zhao | B24B 37/044 216/88 |
| 2007/0108056 A1 | 5/2007 | Nyberg et al. | |
| 2012/0074102 A1 * | 3/2012 | Magara | C11D 7/08 216/83 |
| 2012/0189959 A1 | 7/2012 | Matsuura et al. | |
| 2013/0048215 A1 * | 2/2013 | Higashi | H01L 21/67086 156/345.15 |
| 2013/0240143 A1 | 9/2013 | Kiyose et al. | |
| 2014/0090669 A1 | 4/2014 | Hinode et al. | |
| 2014/0209093 A1 | 7/2014 | Medoff et al. | |
| 2014/0231012 A1 | 8/2014 | Hinode et al. | |
| 2014/0231013 A1 * | 8/2014 | Hinode | C09K 13/04 156/345.23 |
| 2014/0360939 A1 | 12/2014 | Yamada et al. | |
| 2015/0162224 A1 | 6/2015 | Hinode et al. | |
| 2015/0262737 A1 | 9/2015 | Hinode et al. | |
| 2016/0042981 A1 | 2/2016 | Sato et al. | |
| 2016/0075570 A1 | 3/2016 | Hirakawa et al. | |
| 2016/0351417 A1 | 12/2016 | Akeboshi et al. | |
| 2017/0160181 A1 | 6/2017 | Takahashi et al. | |
| 2017/0221725 A1 * | 8/2017 | Muraki | H01L 21/32134 |
| 2018/0090340 A1 * | 3/2018 | Sugioka | H01L 21/67017 |
| 2018/0090346 A1 * | 3/2018 | Sugioka | C09K 13/00 |

FOREIGN PATENT DOCUMENTS

| | | |
|---|---|---|
| JP | 2002-334865 A | 11/2002 |
| JP | 2004-319568 A | 11/2004 |
| JP | 2012-127004 A | 7/2012 |
| JP | 2013-004871 A | 1/2013 |
| JP | 2015-227480 A | 12/2015 |

* cited by examiner

SUBSTRATE PROCESSING DEVICE AND METHOD OF MANUFACTURING SEMICONDUCTOR DEVICE

This application is a divisional of application Ser. No. 15/449,308, filed Mar. 3, 2017, which claims the benefit of and priority to Japanese Patent Application No. 2016-182167, filed Sep. 16, 2016, the entire contents of which are incorporated herein by reference.

FIELD

Embodiments described herein relate generally to a substrate processing device and a method of manufacturing a semiconductor device.

BACKGROUND

A chemical solution containing phosphoric acid, nitric acid, water or the like may be used as a liquid for etching a metal film formed on a wafer-shaped substrate. When such a chemical solution is used, the stability of the etching amount may be impaired due to the concentration change in the chemical solution over time.

SUMMARY

In some embodiments according to one aspect, a substrate processing device may include a first container, a second container, and a control unit. The first container may store a first liquid in which an acid liquid containing phosphoric acid and water are mixed, the first liquid being capable of etching a metal film provided on a substrate. The second container may store a second liquid containing water. The control unit may control supply of the second liquid from the second container to the first container such that a water concentration of the first liquid increases over time corresponding to change in a concentration of the phosphoric acid in the first liquid.

In some embodiments according to one aspect, a method of manufacturing a semiconductor device may include etching a metal film provided on a substrate using a first liquid in which an acid liquid containing phosphoric acid and water are mixed. The first liquid may be stored in a first container. A second liquid containing water stored in a second container may be supplied to the first container such that a water concentration of the first liquid increases over time corresponding to change in a concentration of the phosphoric acid in the first liquid, during the etching.

Other aspects and embodiments of the disclosure are also encompassed. The foregoing summary and the following detailed description are not meant to restrict the disclosure to any particular embodiment but are merely meant to describe some embodiments of the disclosure.

DETAILED DESCRIPTION

An example embodiment provides a substrate processing device capable of stabilizing the etching amount of a metal film provided on a substrate, and a method of manufacturing a semiconductor device.

According to some embodiments, a substrate processing device may include a first container, a second container and a control unit. In some embodiments, the first container is capable of storing a first liquid in which an acid liquid containing phosphoric acid and water are mixed, and the first liquid is capable of etching a metal film provided on a substrate. In some embodiments, the second container is capable of storing a second liquid containing water. In some embodiments, the control unit controls supply of the second liquid from the second container to the first container so that a water concentration of the first liquid increases over time corresponding to change in a concentration of the phosphoric acid in the first liquid.

Embodiments described herein will be described below with reference to the accompanying drawings. The embodiments do not limit the present disclosure.

Figure 1:
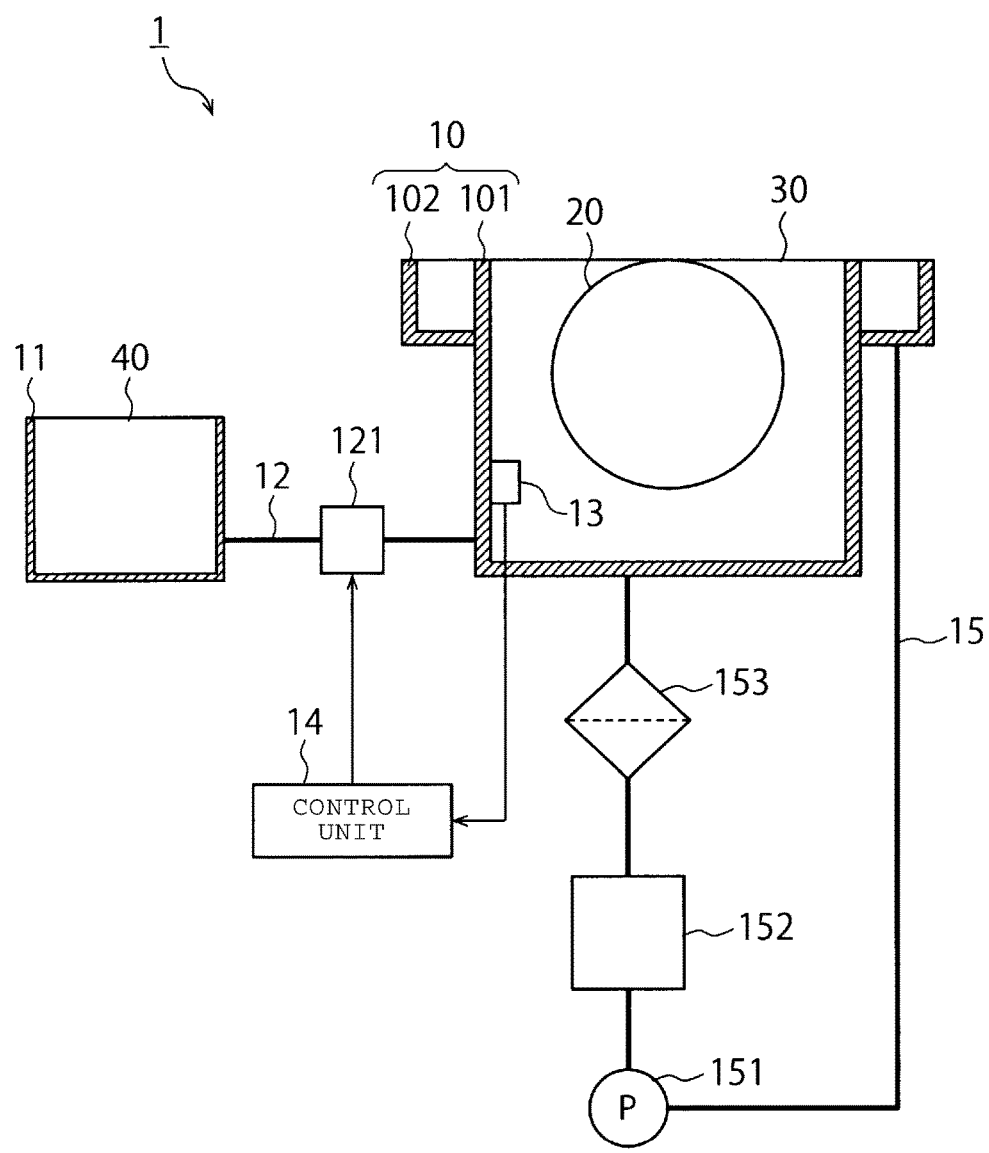
FIG. 1 is a schematic diagram schematically showing a configuration of a substrate processing device according to some embodiments.

FIG. 1 is a schematic diagram schematically showing a configuration of a substrate processing device according to some embodiments. A substrate processing device 1 according to some embodiments is, for example, an etching processing device that removes a metal film (not shown) provided on a wafer-shaped substrate 20 with a liquid 30 (first liquid). In some embodiments, the etching processing device is of a so-called batch processing type in which a plurality of wafers are collectively etched. The substrate 20 is, for example, a three-dimensionally stacked metal film and used for a memory device. In some embodiments, the metal film used for such a substrate 20 contains tungsten (W).

As shown in FIG. 1, the substrate processing device 1 according to some embodiments includes a container 10 (first container), a container 11 (second container), a flow path 12, a sensor 13, a control unit 14 and a circulation path 15.

In some embodiments, the container 10 has an inner tank 101 and an outer tank 102. The liquid 30 is stored in the inner tank 101. In some embodiments, the outer tank 102 surrounds the entire circumference of the inner tank 101. In some embodiments, the outer tank 102 recovers the liquid 30 overflowing from the inner tank 101.

In some embodiments, the liquid 30 contains an acid liquid and water. The acid liquid includes, for example, phosphoric acid, nitric acid and acetic acid. The substrate 20 is accommodated in the inner tank 101. When the substrate 20 is immersed in the liquid 30, in some embodiments, the tungsten contained in the metal film is etched.

In some embodiments, a liquid 40 (second liquid) is stored in the container 11. In some embodiments, the liquid 40 contains water, more specifically, pure water. The liquid 40 may be hot water. In some embodiments, the container 11 may have a mechanism (e.g., a heater) for heating the liquid 40. In some embodiments, the container 11 communicates with the inner tank 101 through the flow path 12. In some embodiments, the liquid 40 is supplied to the inner tank 101 through the flow path 12.

In some embodiments, the flow path 12 is provided with a flow rate adjustment unit 121. In some embodiments, under the control of the control unit 14, the flow rate adjustment unit 121 adjusts the flow rate of the liquid 40 supplied from the container 11 to the inner tank 101.

In some embodiments, the sensor 13 is installed in the inner tank 101. According to some embodiments, the sensor 13 is a water concentration meter that detects the water concentration of the liquid 30. In some embodiments, the sensor 13 outputs the detected water concentration to the control unit 14.

In some embodiments, the control unit 14 controls the flow rate adjustment unit 121 based on the detection result of the sensor 13. That is, the control unit 14 can control the water concentration of the liquid 30. A method of controlling the water concentration by the control unit 14 will be described later.

In some embodiments, the control unit 14 may include a central processing unit (CPU), read-only memory (ROM), random-access memory (RAM), and interfaces. In some embodiments, the RAM may store a table of flow rate of the liquid 40. In some embodiments, the CPU may output a control signal to the flow rate adjustment unit 121 for setting the predetermined flow rate of the liquid 40 based on the water concentration data of the liquid 30 via the sensor 13. In some embodiments, the ROM may store the data of the flow rate of the liquid 40, upper/lower limits of the water concentration. In some embodiments, the CPU can control the water flow rate adjustment unit 121 between the upper limit and the lower limit of the water concentration.

In some embodiment, the RAM may store a table of volume of supplying of the liquid 40 from starting of the etching for a predetermined elapsed time. In some embodiments, the CPU may output a control signal to the flow rate adjustment unit 121 for setting the predetermined flow volume of the liquid 40 based on the table of volume of supplying of the liquid 40.

In some embodiment, the RAM may store a table of time of interval for supplying of the liquid 40 from starting of the etching for a predetermined elapsed time. In some embodiments, the CPU may output a control signal to the flow rate adjustment unit 121 for setting the predetermined flow volume of the liquid 40 based on the table of time of interval for supplying of the liquid 40.

Figure 10:
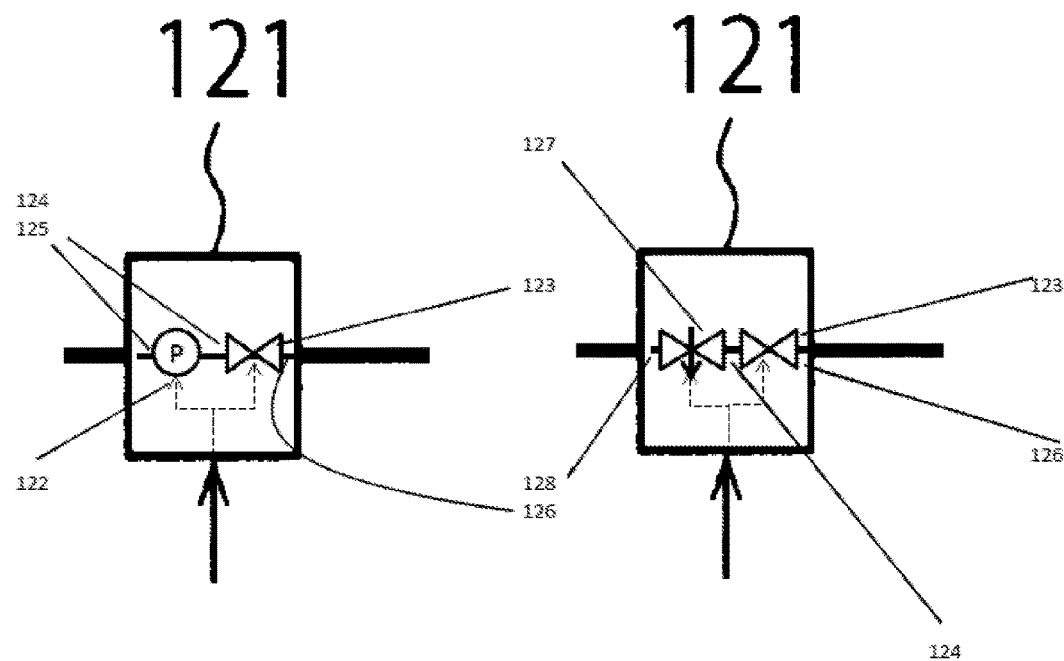
FIG. 10 is a schematic diagram schematically showing a configuration of a flow rate adjustment unit according to some embodiments.

In some embodiment, as shown in FIG. 10, the flow rate adjustment unit 121 includes a pump 122, a solenoid valve 123, a flow path 124 between the pump 122 and the solenoid valve 123, a flow path 125 for the pump 122, a flow path 126 from the solenoid valve 123. In some embodiment, the flow rate adjustment unit 121 may control the number of strokes of the pump per unit time and the open/close state of the solenoid valve 123 based on the signal from the control unit 14 to control the flow volume of the liquid in the flow path 12. In some embodiment, the flow volume of the liquid 40 may change according to the number of strokes of the pump and the degree of the open state of the solenoid valve. In some embodiment, with more number of strokes of the pump and more degree of the open state of the solenoid valve 123, the flow volume of the liquid 40 may increase. In some embodiment, with less number of strokes of the pump and less degree of the open state of the solenoid valve 123, the flow volume of the liquid 40 may decrease.

In some embodiment, as shown in FIG. 10, the flow rate adjustment unit 121 includes a motor-operated valve 127, a solenoid valve 123, a flow path 124 between the motor-operated valve 127 and the solenoid valve 123, a flow path 128 for the motor-operated valve 127, and a flow path 126 from the solenoid valve 123. In some embodiment, the flow rate adjustment unit 121 may control the open/close state of the motor-operated valve 127 and solenoid valve 123 to control the flow volume of the liquid in the flow path 12. In some embodiment, the flow volume of the liquid 40 may change according to the degree of the open state of the motor-operated valve 127 and the solenoid valve 123. In some embodiment, with more degree of the open state of the motor-operated valve 127 and the solenoid valve 123, the flow volume of the liquid 40 may increase. In some embodiment, with less degree of the open state of the motor-operated valve 127 and the solenoid valve 123, the flow volume of the liquid 40 may decrease.

In some embodiments, the circulation path 15 communicates with the outer tank 102 and the inner tank 101. In some embodiments, the liquid 30 in the outer tank 102 is refluxed to the inner tank 101. In this way, the circulation path 15 can circulate the liquid 30 with respect to (or through) the container 10. In this circulation process, in some embodiments, the liquid 30 passes through a pump 151, a heater 152 and a filter 153.

In some embodiments, the pump 151 pressurizes the inside of the circulation path 15 and causes the liquid 30 to reflux from the outer tank 102 to the inner tank 101. In some embodiments, the heater 152 heats the liquid 30 to, for example, about 50° C. to 90° C. In some embodiments, the filter 153 removes foreign matter contained in the liquid 30.

Figure 2:
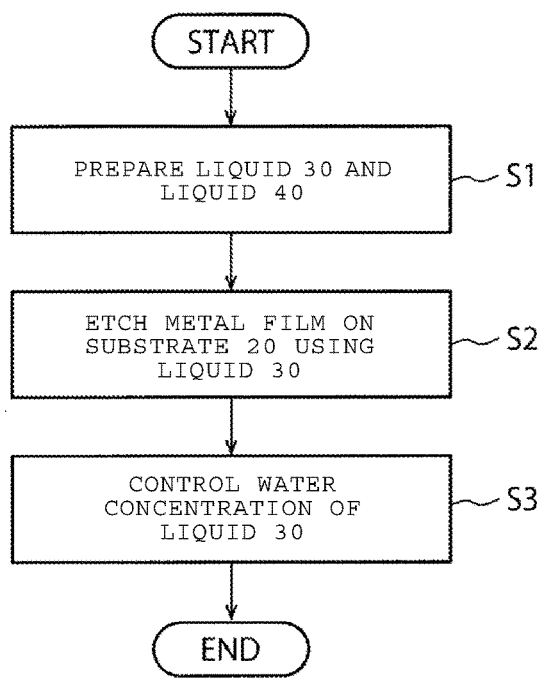
FIG. 2 is a flowchart showing a flow of a substrate processing process.

The manufacturing process of a semiconductor device according to some embodiments will now be described. Here, a substrate processing process which is one of the manufacturing processes will be described with reference to FIG. 2. FIG. 2 is a flowchart showing a flow of the substrate processing process.

First, in some embodiments, the liquid 30 and the liquid 40 are prepared (step S1). In some embodiments, the liquid 30 is stored in the container 10, and the liquid 40 is stored in the container 11. At this time, the temperature of the liquid 30 is, for example, about 50° C. to 90° C.

Next, in some embodiments, the metal film provided on the substrate 20 is etched using the liquid 30 (step S2). In some embodiments, the substrate 20 is immersed in the liquid 30 stored in the inner tank 101. As a result, the tungsten contained in the metal film can be removed.

With the start of the etching, in some embodiments, the control unit 14 controls the water concentration of the liquid 30 (step S3). Here, the operation of step S3 will be described with reference to FIG. 3.

Figure 3:
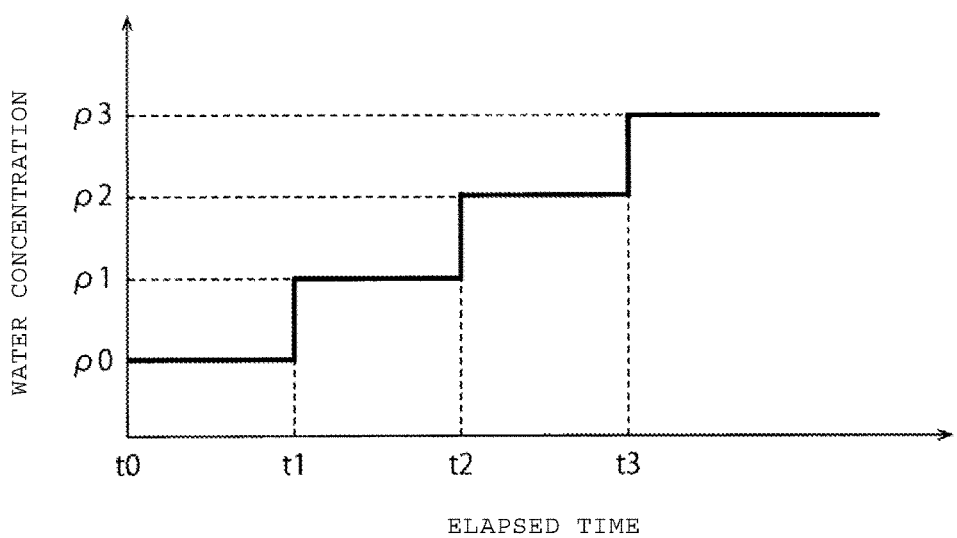
FIG. 3 is a diagram illustrating a method of controlling the concentration of water according to some embodiments.

FIG. 3 is a diagram illustrating a method of controlling the concentration of water according to some embodiments. In FIG. 3, the horizontal axis represents the elapsed time since the liquid 30 is newly prepared, in other words, the etching time of the substrate 20. The vertical axis represents the water concentration in the liquid 30.

As shown in FIG. 3, in some embodiments, set values of the water concentration $p1$ to $p3$ are preset for respective liquid supply start times $t1$ to $t3$. Each set value $p1$ to $p3$ satisfies the relationship of p1<p2<p3. That is, the set values of the water concentration increase over time.

For example, when the elapsed time from the etching start time t0 reaches the liquid supply start time t1, the control unit 14 controls the flow rate adjustment unit 121 so that the water concentration of the liquid 30 rises from the initial value p0 to the set value p1. In some embodiments, the control unit 14 controls the supply of the liquid 40 so that the detection value of the sensor 13 matches the set value p1.

In some embodiments, during a period from the liquid supply start time t1 to the liquid supply start time t2, the control unit 14 stops the supply of the liquid 40 by using the flow rate adjustment unit 121. Thereafter, in some embodiments, the control unit 14 intermittently supplies the liquid 40 so that the water concentration of the liquid 30 becomes the set value that is set at the liquid supply start time t2.

Figure 4:
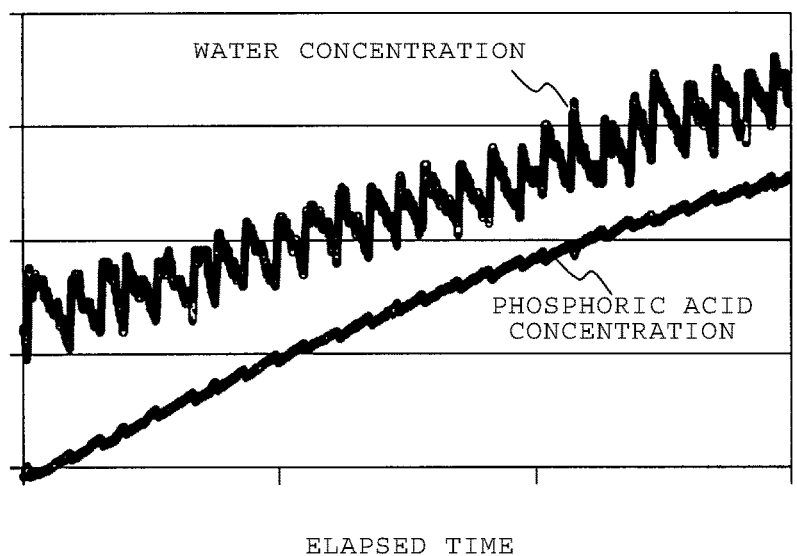
FIG. 4 is a diagram showing a change over time in the concentration of phosphoric acid and water in a liquid.
Figure 5:
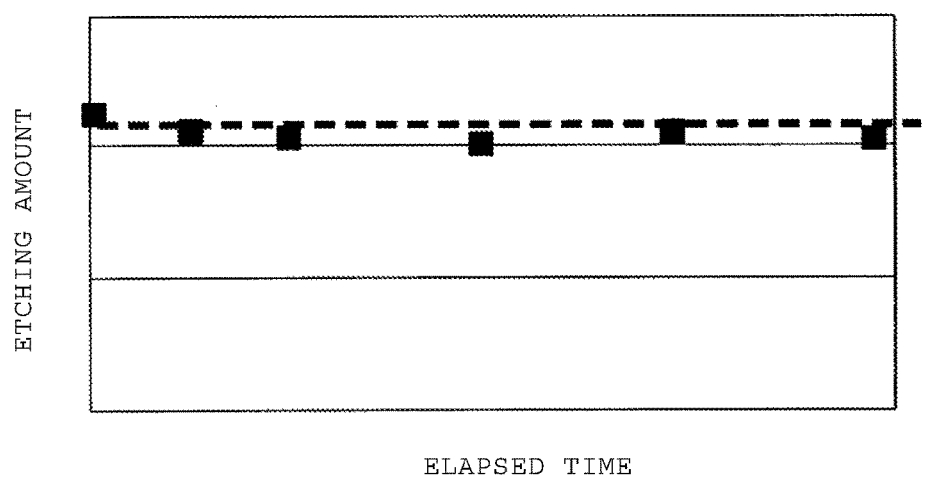
FIG. 5 is a diagram showing a change over time in the etching amount of tungsten contained in the metal film.

FIG. 4 is a diagram showing a change over time in the concentration of the phosphoric acid and the water in the liquid 30. Further, FIG. 5 is a diagram showing a change over time in the etching amount of the tungsten contained in the metal film. By the etching in step S2 (see FIG. 2), the nitric acid and the acetic acid contained in the liquid 30 are volatilized, while the phosphoric acid is not volatilized. As a result, as shown in FIG. 4, the phosphoric acid concentration relatively increases in the liquid 30. According to the experimental result, the correlation between the phosphoric acid concentration and the etching amount of the tungsten is high. In addition, according to the experimental result, the correlation between the fluctuation of the water concentration and the etching amount is also high.

Therefore, in some embodiments as shown in FIG. 4, the control unit 14 controls the supply of the liquid 40 from the container 11 to the container 10 so that the water concentration of the liquid 30 increases over time corresponding to the change in the concentration of the phosphoric acid in the liquid 30. As a result, as shown in FIG. 5, the etching amount of the tungsten can be stabilized.

In some embodiments, the detection target of the sensor 13 is the water concentration of the liquid 30, but it may be another physical property value. For example, the sensor 13 may be any of a phosphoric acid concentration meter that detects the phosphoric acid concentration of the liquid using the absorbance, a viscometer that detects the viscosity of the liquid 30, or a specific gravity meter that detects the specific gravity of the liquid 30 using pressure. In some embodiments, the sensor 13 may be a current meter for detecting the flow velocity of the liquid 30 flowing through the circulation path 15. In this case, the sensor 13 is provided, for example, on the pump 151. The flow velocity can be determined, for example, based on the number of strokes of the pump 151.

In some embodiments, as the etching time of the substrate 20 elapses, the phosphoric acid concentration, the viscosity and the specific gravity increase, and the flow velocity decreases. In some embodiments, the viscosity, the specific gravity and the flow velocity correspond to the phosphoric acid concentration.

Then, in some embodiments, the control unit 14 controls the supply amount of the liquid 40 using the flow rate adjustment unit 121 so that the water concentration of the liquid 40 increases corresponding to the change in the phosphoric acid concentration directly or indirectly detected. Even with such a control method, the etching amount of the tungsten can be stabilized.

In some embodiments, the liquid 40 added to the liquid 30 is water. In some embodiments, among the acid liquids contained in the liquid 30, the liquid 40 may be an acid liquid other than phosphoric acid. For example, the liquid 40 may be an acid liquid containing at least one of nitric acid and acetic acid. Since nitric acid and acetic acid volatilize during etching as described above, these concentrations decrease. Therefore, by adding an acid liquid containing at least one of nitric acid and acetic acid to the liquid 30 as the liquid 40, the liquid 30 can be in an optimum state for etching.

Figure 6:
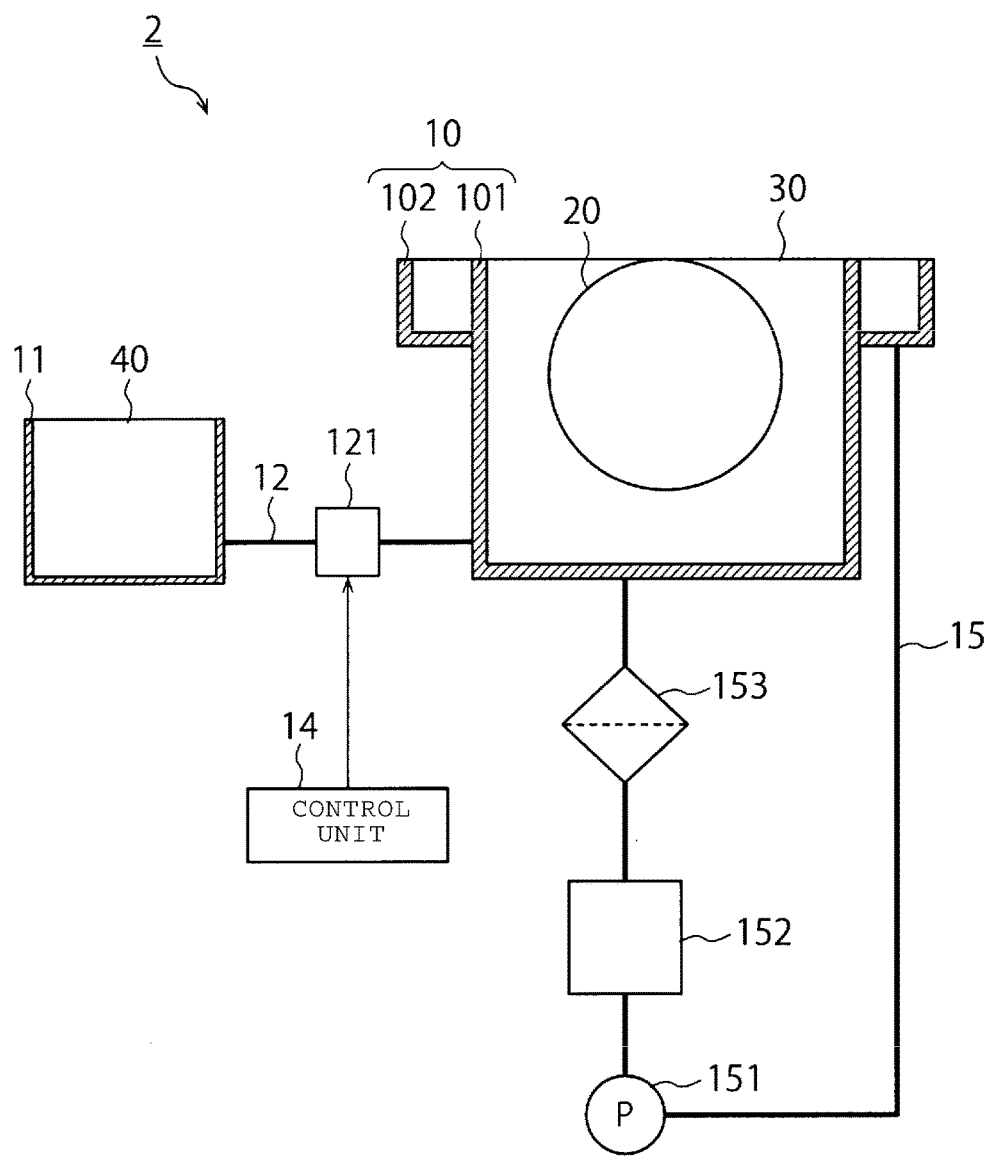
FIG. 6 is a schematic diagram schematically showing a configuration of a substrate processing device according to some embodiments.

FIG. 6 is a schematic diagram schematically showing a configuration of a substrate processing device according to some embodiments. In FIG. 6, components similar to those illustrated in FIG. 1 are denoted by the same reference numerals, and detailed description thereof will be omitted.

As shown in FIG. 6, in some embodiments, the substrate processing device 2 does not include the sensor 13. In the substrate processing device 2, the control unit 14 controls the water concentration of the liquid 40 during etching without using the sensor 13. Hereinafter, a method of controlling the water concentration according to some embodiments will be described with reference to FIG. 7.

Figure 7:
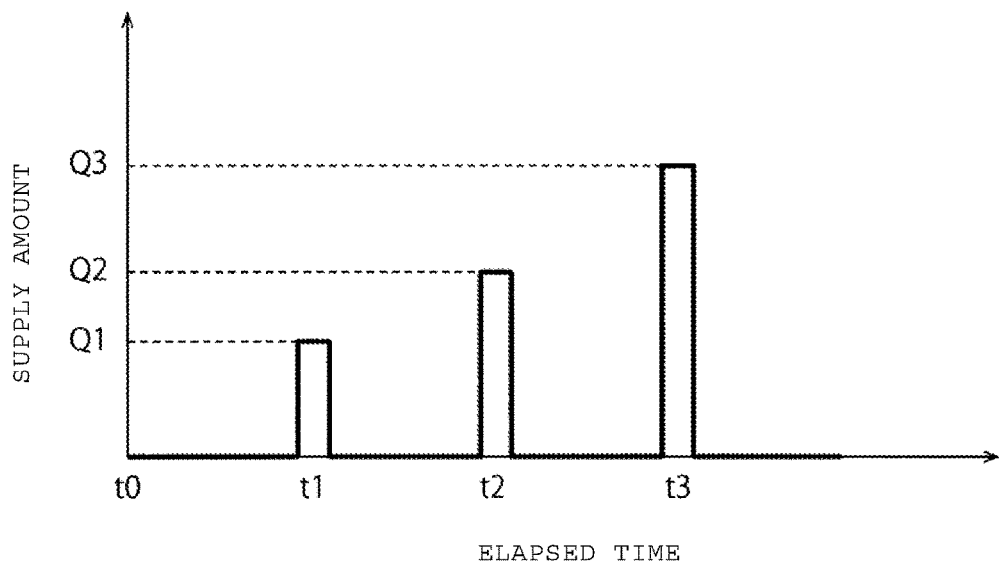
FIG. 7 is a diagram illustrating a method of controlling the concentration of water according to some embodiments.

FIG. 7 is a diagram illustrating a method of controlling the concentration of water according to some embodiments. In FIG. 7, the horizontal axis represents the elapsed time since the liquid 30 is newly prepared, in other words, the etching time of the substrate 20. The vertical axis represents the supply amounts of the liquid 40 supplied from the container 11 to the container 10.

As shown in FIG. 7, in some embodiments, the supply amounts Q1 to Q3 of the liquid 40 are preset for respective liquid supply start times t1 to t3. The supply amounts Q1 to Q3 satisfy the relationship of Q1<Q2<Q3. In some embodiments, each of the supply amounts Q1 to Q3 is optimized or adjusted in advance corresponding to the change in the concentration of the phosphoric acid in the liquid 30 so that the etching amount of the tungsten becomes constant.

For example, when the elapsed time from the etching start time t0 reaches the liquid supply start time t1, the control unit 14 supplies the liquid 40 to the container 10 using the flow rate adjustment unit 121.

In some embodiments, the control unit 14 controls the flow rate adjustment unit 121 to stop the supply of the liquid 40 until the liquid supply start time t2 is reached since the liquid supply start time t1 elapsed. Thereafter, in some embodiments, the control unit 14 intermittently supplies the liquid 40 of the supply amount set for each liquid supply start time.

According to some embodiments, the supply amount of the liquid 40 is preset so as to increase over time. Therefore, by optimizing or adjusting the supply amount of each time corresponding to the water concentration at which the etching amount of the tungsten becomes constant, the water concentration of the liquid 30 can be increased according to the change in the concentration of the phosphoric acid. Therefore, the etching amount of the tungsten can be stabilized.

Further, in some embodiments, the sensor 13 is unnecessary. Therefore, the device configuration can be simplified.

Hereinafter, a method of controlling the water concentration according to some embodiments will be described with reference to FIG. 8. In some embodiments, the substrate processing device 2 as illustrated in FIG. 6 can control the water concentration of the liquid 40 during etching using the method illustrated in FIG. 8.

Figure 8:
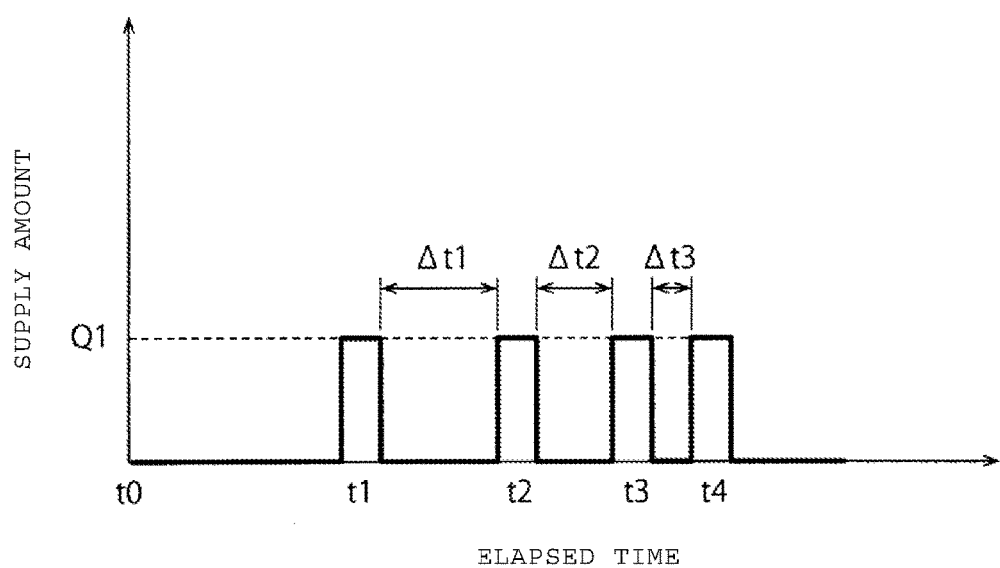
FIG. 8 is a diagram illustrating a method of controlling the concentration of water according to some embodiments.

FIG. 8 is a diagram illustrating a method of controlling the concentration of water according to some embodiments. In FIG. 8, the horizontal axis represents the elapsed time since the liquid 30 is newly prepared, in other words, the etching time of the substrate 20. The vertical axis represents the supply amounts of the liquid 40 supplied from the container 11 to the container 10.

As shown in FIG. 8, in some embodiments, the supply amount Q1 of the liquid 40 is always constant. In some embodiments, the intervals Δt1 to Δt3 of the liquid supply start time satisfy the relationship of Δt1>Δt2>Δt3. That is, in some embodiments, the supply interval of the liquid 40 is shortened over time. In some embodiments, each of the intervals Δt1 to Δt3 is optimized or adjusted in advance corresponding to the change in the concentration of the phosphoric acid in the liquid 30 so that the etching amount of the tungsten becomes constant.

For example, when the elapsed time from the etching start time t0 reaches the liquid supply start time t1, the control unit 14 supplies the liquid 40 to the container 10 using the flow rate adjustment unit 121.

In some embodiments, in the interval between the liquid supply start time t1 and the liquid supply start time t2, that is, the interval Δt1, the control unit 14 controls the flow rate adjustment unit 121 to stop the supply of the liquid 40. Thereafter, in some embodiments, the control unit 14 supplies the liquid 40 to the container 10 using the flow rate adjustment unit 121 at the liquid supply start times t3 and t4.

According to some embodiments, the supply interval of the liquid 40 is preset so as to be shortened over time. Therefore, in some embodiments, by optimizing or adjusting each interval corresponding to the water concentration at which the etching amount of the tungsten becomes constant, the water concentration of the liquid 30 can be increased according to the change in the concentration of the phosphoric acid. Therefore, the etching amount of the tungsten can be stabilized.

Also in some embodiments, the sensor 13 is unnecessary. Therefore, the device configuration can be simplified.

Figure 9:
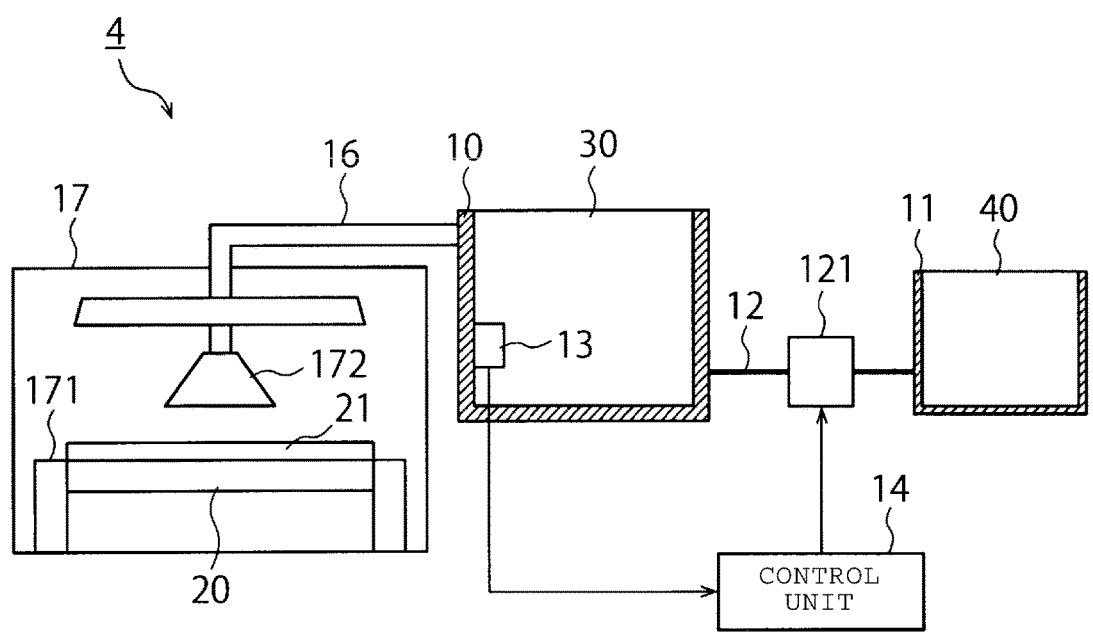
FIG. 9 is a schematic diagram schematically showing a configuration of a substrate processing device according to some embodiments.

FIG. 9 is a schematic diagram schematically showing a configuration of a substrate processing device according to some embodiments. In some embodiments, the substrate processing device 4 is a single wafer etching device which etches a wafer one by one.

In FIG. 9, components similar to those of the substrate processing device 1 illustrated in FIG. 1 are denoted by the same reference numerals, and detailed description thereof will be omitted. The substrate processing device 4 according to some embodiments includes a container 10, a container 11, a flow path 12, a sensor 13, a control unit 14, a supply path 16 and an etching processing unit 17. Hereinafter, the supply path 16 and the etching processing unit 17 will be described.

In some embodiments, the supply path 16 is provided between the etching processing unit 17 and the container 10. In some embodiments, the liquid 30 stored in the container 10 is supplied to the etching processing unit 17 through the supply path 16.

In some embodiments, the etching processing unit 17 is provided with a stage 171 and a nozzle 172. In some embodiments, the stage 171 holds the substrate 20 on which the metal film 21 is formed. In some embodiments, the metal film 21 contains tungsten. In some embodiments, the nozzle 172 is connected to one end of the supply path 16. In some embodiments, the nozzle 172 has a discharge port (not shown) for discharging the liquid 30 supplied from the container 10 to the substrate 20 through the supply path 16.

In some embodiments, in the substrate processing device 4, similarly to the substrate processing device 1, the control unit 14 controls the flow rate of the liquid 40 supplied from the container 11 to the container 10 based on the detection result of the sensor 13. Therefore, in some embodiments, during the etching of the metal film 21 of the substrate 20, the water concentration of the liquid 30 can be increased corresponding to the phosphoric acid concentration. Therefore, the etching amount of the tungsten contained in the metal film 21 can be stabilized.

Further, in some embodiments, the supply amount of the liquid 40 may be preset so as to increase over time. Further, in some embodiments, the supply interval of the liquid 40 may be preset so as to be shortened over time. In these cases, the etching amount of the tungsten can be stabilized without using the sensor 13.

In some embodiments, in the substrate processing device 4, a flow path (not shown) for returning the liquid 30 recovered by the etching processing unit 17 to the container 10 may be provided. In this case, the liquid 30 can be utilized without waste.

While certain embodiments have been described, these embodiments have been presented byway of example only, and are not intended to limit the scope of the disclosure. Indeed, the embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of manufacturing a semiconductor device, comprising:
    etching a metal film provided on a substrate using a first liquid in which an acid liquid containing phosphoric acid and water are mixed, the first liquid being stored in a first container;
    supplying a second liquid containing water stored in a second container to the first container such that a water concentration of the first liquid increases over time corresponding to change in a concentration of the phosphoric acid in the first liquid, during the etching; and
    intermittently supplying the second liquid based on a supply amount which is preset so as to increase over time.

2. The method according to claim 1, wherein the metal film contains tungsten.

3. The method according to claim 2, the second liquid contains at least one of nitric acid or acetic acid.

4. The method according to claim 1, the second liquid contains at least one of nitric acid or acetic acid.

5. A method of manufacturing a semiconductor device, comprising:
    etching a metal film provided on a substrate using a first liquid in which an acid liquid containing phosphoric acid and water are mixed, the first liquid being stored in a first container;
    supplying a second liquid containing water stored in a second container to the first container such that a water concentration of the first liquid increase over time corresponding to change in a concentration of the phosphoric acid in the first liquid, during the etching; and
    intermittently supplying the second liquid at intervals which are preset so as to be shortened over time.

6. The method according to claim 5, wherein the metal film contains tungsten.

7. The method according to claim 6, the second liquid contains at least one of nitric acid or acetic acid.

8. The method according to claim 5, the second liquid contains at least one of nitric acid or acetic acid.

* * * * *